United States Patent
Yu et al.

(10) Patent No.: US 11,769,806 B2
(45) Date of Patent: Sep. 26, 2023

(54) BIPOLAR JUNCTION TRANSISTORS INCLUDING WRAP-AROUND EMITTER AND COLLECTOR CONTACTS

(71) Applicant: GlobalFoundries U.S. Inc., Malta, NY (US)

(72) Inventors: Hong Yu, Clifton Park, NY (US); Jagar Singh, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 55 days.

(21) Appl. No.: 17/525,236

(22) Filed: Nov. 12, 2021

(65) Prior Publication Data

US 2023/0075062 A1   Mar. 9, 2023

Related U.S. Application Data

(60) Provisional application No. 63/241,742, filed on Sep. 8, 2021.

(51) Int. Cl.
| | |
|---|---|
| *H01L 29/417* | (2006.01) |
| *H01L 29/66* | (2006.01) |
| *H01L 29/40* | (2006.01) |
| *H01L 29/737* | (2006.01) |
| *H01L 29/735* | (2006.01) |

(52) U.S. Cl.
CPC ...... *H01L 29/41708* (2013.01); *H01L 29/401* (2013.01); *H01L 29/66242* (2013.01); *H01L 29/735* (2013.01); *H01L 29/737* (2013.01)

(58) Field of Classification Search
CPC ............ H01L 29/41708; H01L 29/401; H01L 29/66242; H01L 29/735; H01L 29/737; H01L 27/0647–067; H01L 27/0711–0722; H01L 27/075–0783; H01L 27/082–0828; H01L 29/0804–0826; H01L 29/1004–1008; H01L 29/66234–66348; H01L 29/73–749; H01L 29/41783; H01L 29/66636

See application file for complete search history.

(56) References Cited

U.S. PATENT DOCUMENTS

| | | | |
|---|---|---|---|
| 6,949,764 B2 | 9/2005 | Ning | |
| 8,288,758 B2 | 10/2012 | Ning et al. | |
| 8,420,493 B2 | 4/2013 | Ning et al. | |
| 8,586,441 B1 | 11/2013 | Cai et al. | |
| 10,825,921 B2 | 11/2020 | Balakrishnan et al. | |
| 2012/0235151 A1* | 9/2012 | Cai | H01L 29/66265 257/65 |
| 2018/0269289 A1* | 9/2018 | Balakrishnan | H01L 29/735 |
| 2021/0134987 A1* | 5/2021 | Yang | H01L 29/0657 |

* cited by examiner

*Primary Examiner* — Shahed Ahmed
(74) *Attorney, Agent, or Firm* — Thompson Hine LLP; Francois Pagette

(57) ABSTRACT

Structures for a bipolar junction transistor and methods of forming a structure for a bipolar junction transistor. The structure includes a first terminal having a first raised semiconductor layer having a top surface and a side surface, a second terminal having a second raised semiconductor layer, and a base layer positioned in a lateral direction between the first raised semiconductor layer of the first terminal and the second raised semiconductor layer of the second terminal. The structure further includes a contact positioned to overlap with the top surface and the side surface of the first raised semiconductor layer.

20 Claims, 4 Drawing Sheets

US 11,769,806 B2

BIPOLAR JUNCTION TRANSISTORS INCLUDING WRAP-AROUND EMITTER AND COLLECTOR CONTACTS

CROSS-REFERENCE TO RELATED APPLICATIONS

This application claims the benefit of U.S. Provisional Application No. 63/241,742, filed Sep. 8, 2021, which is hereby incorporated by reference herein in its entirety.

BACKGROUND

The disclosure relates generally to semiconductor devices and integrated circuit fabrication and, in particular, to structures for a bipolar junction transistor and methods of forming a structure for a bipolar junction transistor.

A bipolar junction transistor is a multi-terminal electronic device with a structure that includes an emitter, a collector, and an intrinsic base arranged between the emitter and collector. In an NPN bipolar junction transistor, the emitter and collector are comprised of n-type semiconductor material, and the intrinsic base is comprised of p-type semiconductor material. In a PNP bipolar junction transistor, the emitter and collector are comprised of p-type semiconductor material, and the intrinsic base is comprised of n-type semiconductor material. During operation, the base-emitter junction is forward biased, the base-collector junction is reverse biased, and the collector-emitter current may be controlled by varying the base-emitter voltage.

A heterojunction bipolar transistor is a variant of a bipolar junction transistor in which the semiconductor materials of the terminals have different energy bandgaps, which creates heterojunctions. For example, the collector and/or emitter of a heterojunction bipolar transistor may be comprised of silicon, and the intrinsic base of a heterojunction bipolar transistor may be comprised of silicon-germanium, which is characterized by a narrower band gap than silicon.

Improved structures for a bipolar junction transistor and methods of forming a structure for a bipolar junction transistor are needed.

SUMMARY

In an embodiment of the invention, a structure for a lateral bipolar junction transistor is provided. The structure includes a first terminal having a first raised semiconductor layer having a top surface and a side surface, a second terminal having a second raised semiconductor layer, and a base layer positioned in a lateral direction between the first raised semiconductor layer of the first terminal and the second raised semiconductor layer of the second terminal. The structure further includes a contact positioned to overlap with the top surface and the side surface of the first raised semiconductor layer.

In an embodiment of the invention, a method of forming a structure for a lateral bipolar junction transistor is provided. The method includes forming a first terminal including a first raised semiconductor layer that has a top surface and a side surface, forming a second terminal including a second raised semiconductor layer, and forming a base layer positioned in a lateral direction between the first raised semiconductor layer of the first terminal and the second raised semiconductor layer of the second terminal. The method further includes forming a contact positioned to overlap with the top surface and the side surface of the first raised semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 5 is a diagrammatic layout view of the structure, simplified for clarity, in which FIG. 4 is taken generally along line 4-4.

DETAILED DESCRIPTION

Figure 1:
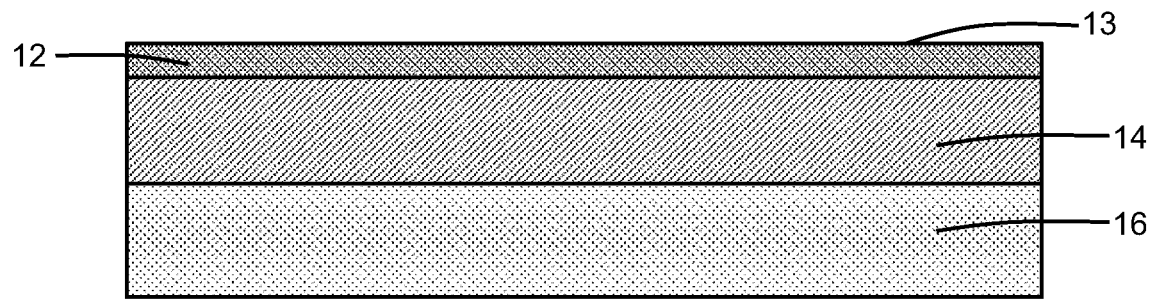
FIG. 1 is a cross-sectional of a structure in accordance with embodiments of the invention.

With reference to FIG. 1 and in accordance with embodiments of the invention, a device structure is formed using a semiconductor-on-insulator (SOI) substrate that includes a device layer 12, a buried insulator layer 14, and a handle substrate 16. The device layer 12 is separated from the handle substrate 16 by the intervening buried insulator layer 14. The device layer 12 and the handle substrate 16 may be comprised of a semiconductor material, such as single-crystal silicon, and the handle substrate 16 may be lightly doped to have, for example, p-type conductivity. The buried insulator layer 14 may be comprised of a dielectric material, such as silicon dioxide, that electrically isolates the device layer 12 from the handle substrate 16. The buried insulator layer 14 adjoins the handle substrate 16 along a lower interface, and the buried insulator layer 14 adjoins the device layer 12 along an upper interface. The device layer 12 has a thickness that may be measured between the top surface 13 and the upper interface. In an embodiment, the device layer 12 may have a thickness in a range of about 4 nanometers (nm) to about 100 nm. In an embodiment, the device layer 12 may have a thickness suitable to fabricate fully-depleted silicon-on-insulator (FDSOI) device structures.

Figure 2:
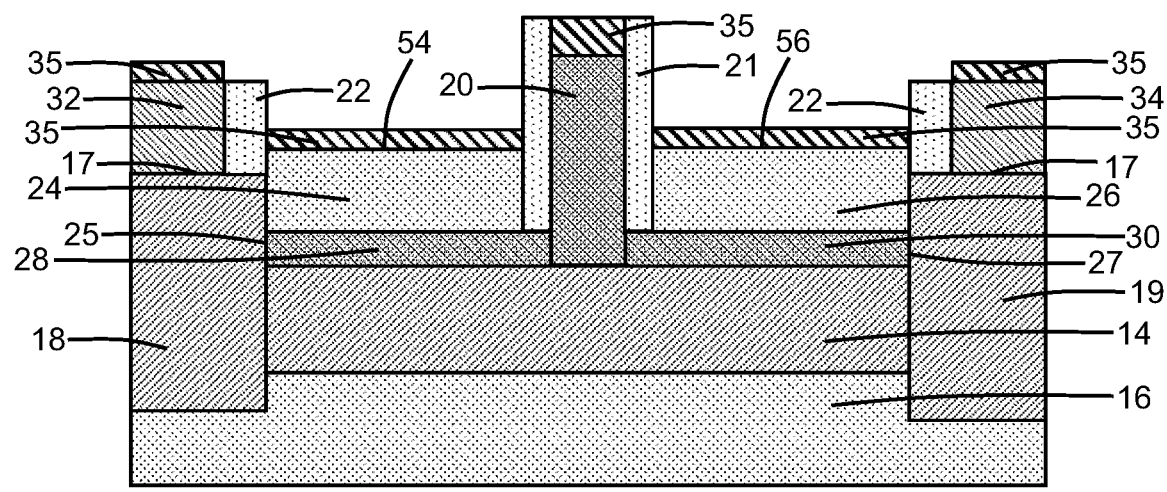
FIG. 2 is a cross-sectional view of the structure at a fabrication stage subsequent to FIG. 1.

With reference to FIG. 2 in which like reference numerals refer to like features in FIG. 1 and at a subsequent fabrication stage, shallow trench isolation regions 18, 19 are formed that extend fully through the device layer 12 and that surround an active region of the device layer 12. The shallow trench isolation regions 18, 19 may be formed by etching trenches that penetrate through the device layer 12 using a patterned hardmask, depositing a dielectric material, such as silicon dioxide, in the trenches, and planarizing with chemical-mechanical polishing. The shallow trench isolation regions 18, 19 may have respective top surfaces 17 that are coplanar. The device layer 12 includes a side surface 25 that abuts the shallow trench isolation region 18 and an opposite side surface 27 that abuts the shallow trench isolation region 19.

A base layer 20 has a lower portion positioned inside an opening in the device layer 12 and an upper portion above the lower portion. The upper portion of the base layer 20 may be surrounded by a dielectric spacer 21. The base layer 20 may comprise a single-crystal semiconductor material, which may be epitaxially grown from the device layer 12. In an embodiment, the semiconductor material of the base layer 20 may be comprised at least in part of silicon-germanium including silicon and germanium with the silicon content ranging from 95 atomic percent to 50 atomic percent and the germanium content ranging from 5 atomic percent to 50 atomic percent. The germanium content of the base layer 20 may be uniform, or the germanium content of the base layer 20 may have a graded profile and/or a stepped profile across its thickness that may include portions that lack germanium. The base layer 20 may be in situ doped during epitaxial growth with a concentration of a dopant, such as a p-type dopant (e.g., boron) that provides p-type conductivity.

Raised semiconductor layers 24, 26 are formed on the exposed areas of the top surface 13 of the device layer 12 adjacent to the opposite sidewalls of the base layer 20. The base layer 20 is positioned in a lateral direction between the semiconductor layer 24 and the semiconductor layer 26. The dielectric spacer 21 separates and electrically insulates the semiconductor layers 24, 26 from the base layer 20.

The raised semiconductor layers 24, 26 may be formed by the epitaxial growth of single-crystal semiconductor material (e.g., single-crystal silicon) from the top surface 13 of the device layer 12 over exposed surface areas between the shallow trench isolation regions 18, 19 and the dielectric spacer 21. The crystal structure of the single-crystal semiconductor material of the device layer 12 serves as a crystalline template for the crystal structure of the single-crystal semiconductor material of the semiconductor layers 24, 26. In an embodiment, the semiconductor material of the semiconductor layers 24, 26 may be doped (e.g., heavily doped) with a concentration of a dopant, such as an n-type dopant (e.g., phosphorus) that provides n-type conductivity.

A doped region 28 may be formed in a section of the device layer 12 by dopant diffused from the semiconductor layer 24 into the device layer 12. A doped region 30 may be formed in a section of the device layer 12 by dopant diffused from the semiconductor layer 26 into the device layer 12. For example, an optional rapid thermal anneal may be utilized to cause the dopant diffusion.

Edge features 32, 34 are positioned adjacent to the side surfaces 50, 52 (FIG. 3) of the semiconductor layers 24, 26. In particular, the edge feature 32 may be arranged on the shallow trench isolation region 18 adjacent to the side surface 50 of the semiconductor layer 24, and the edge feature 34 may be arranged on the shallow trench isolation region 19 adjacent to the side surface 52 of the semiconductor layer 26. The edge features 32, 34 may be formed by depositing a layer of a material, such as polysilicon (i.e., polycrystalline silicon), and patterning the layer with lithography and etching processes. Spacers 22 may be arranged adjacent to the sidewalls of each of the edge features 32, 34. The edge features 32, 34 are dummy features that are non-functional during device operation.

A silicide layer 35 is arranged in sections on the semiconductor layers 24, 26, the base layer 20, and the edge features 32, 34. The silicide layer 35, which may be formed by a silicidation process, may contain nickel silicide. The silicidation process may involve the deposition of a layer of a silicide-forming metal (e.g., nickel) by, for example, chemical vapor deposition or physical vapor deposition, followed by one or more annealing steps (e.g., rapid thermal annealing) to form a silicide phase by reacting the layer of silicide-forming metal and the contacting semiconductor material of the semiconductor layers 24, 26, the base layer 20, and the edge features 32, 34.

The semiconductor layer 24 and the doped region 28 may define a terminal of a lateral bipolar junction transistor (e.g., a lateral heterojunction bipolar transistor). The semiconductor layer 26 and the doped region 30 may define another terminal of the lateral bipolar junction transistor. The semiconductor layers 24, 26 provide raised portions of the terminals that are located on the device layer 12, and the doped regions 28, 30 provide non-raised portions of the terminals that are located inside the device layer 12. In an embodiment, the semiconductor layer 24 and the doped region 28 may provide the collector of a lateral bipolar junction transistor, the semiconductor layer 26 and the doped region 30 may provide an emitter of the lateral bipolar junction transistor, and the base layer 20 may provide an intrinsic base of the lateral bipolar junction transistor.

Figure 3:
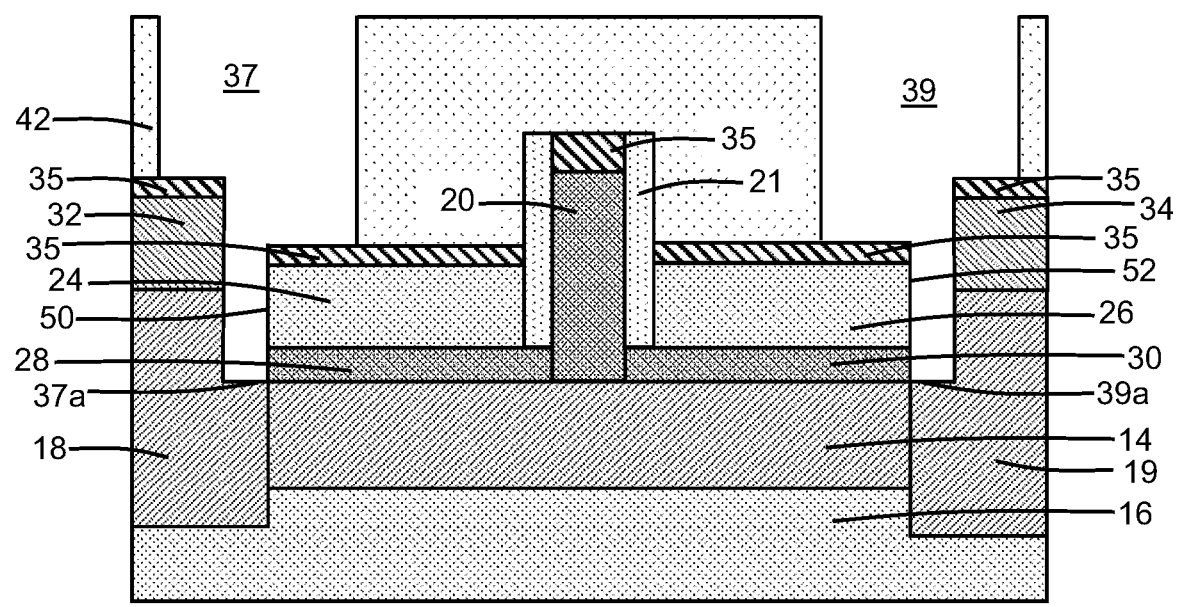
FIG. 3 is a cross-sectional view of the structure at a fabrication stage subsequent to FIG. 2.

With reference to FIG. 3 in which like reference numerals refer to like features in FIG. 2 and at a subsequent fabrication stage, a dielectric layer 42 is formed over the lateral bipolar junction transistor and the edge features 32, 34. The dielectric layer 42 may be comprised of a dielectric material, such as silicon dioxide, that is deposited and polished by chemical-mechanical polishing to eliminate topography.

Openings 37, 39 are patterned in the dielectric layer 42 and shallow trench isolation regions 18, 19 by lithography and etching processes. The patterning of the openings 37, 39 may also fully remove the spacers 22 at the sides of the edge features 32, 34. Openings (not shown) are also patterned that penetrate in a vertical direction through the dielectric layer 42 to respective widened end portions of the base layer 20.

The opening 37 overlaps with the side surface 50 and the top surface 54 (FIG. 2) of the semiconductor layer 24. The opening 37, which has a width dimension that varies with height, extends to a bottom 37a that is bordered by the dielectric material of the shallow trench isolation region 18. The bottom 37a of the opening 37 may be located at an elevation between the top surface 13 of the device layer 12 and the interface between the device layer 12 and buried insulator layer 14. The opening 37 step-wise widens with increasing distance from the bottom 37a of the opening 37. The opening 37 may also overlap with the top and side surfaces of the edge feature 32.

The opening 39 overlaps with the side surface 52 and the top surface 56 (FIG. 2) of the semiconductor layer 24. The opening 39, which has a width dimension that varies with height, extends to a bottom 39a that is bordered by the dielectric material of the shallow trench isolation region 18. The bottom 39a of the opening 39 may be located at an elevation between the top surface 13 of the device layer 12 and the interface between the device layer 12 and buried insulator layer 14. The opening 39 step-wise widens with increasing distance from the bottom 39a of the opening 39. The opening 39 may also overlap with the side and top surfaces of the edge feature 34.

The side surface 50 of the semiconductor layer 24 is exposed at the sidewall of the opening 37 and is positioned adjacent to the edge feature 32 and shallow trench isolation region 18. The side surface 52 of the semiconductor layer 26 is exposed at the sidewall of the opening 39 and is positioned adjacent to the edge feature 34 and shallow trench isolation region 19. The side surfaces 25, 27 (FIG. 2) of the device layer 12 are also exposed at the sidewall of the opening 39.

Figure 4:
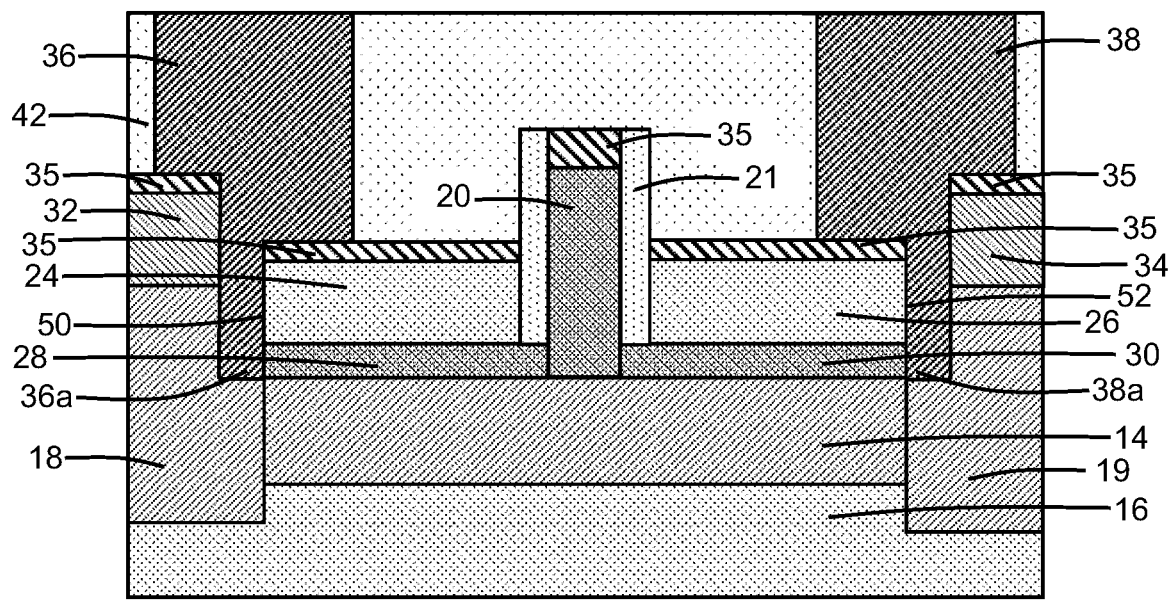
FIG. 4 is a cross-sectional view of the structure at a fabrication stage subsequent to FIG. 3.
Figure 5:
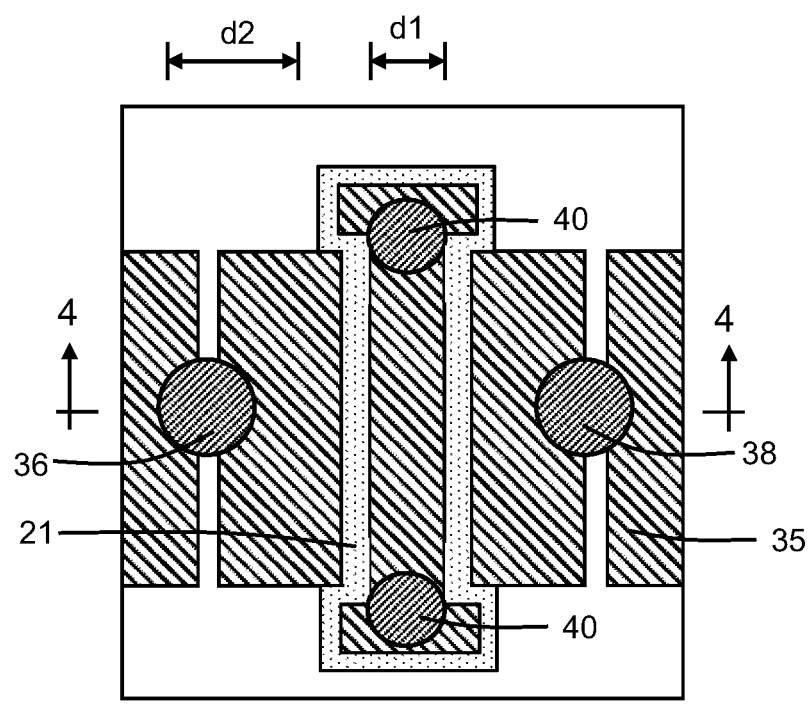

With reference to FIGS. 4, 5 in which like reference numerals refer to like features in FIG. 3 and at a subsequent fabrication stage, contacts 36, 38, 40 are formed by middle-of-line processing. The contacts 36, 38, 40 may be formed by depositing a metal, such as tungsten, and planarization with chemical-mechanical polishing. The contact 36 formed in the opening 37 (FIG. 2) in the dielectric layer 42 may be electrically and physically connected to the semiconductor layer 24, the contact 38 formed in the opening 39 (FIG. 2) in the dielectric layer 42 may be electrically and physically connected to the semiconductor layer 26, and the contacts 40 may be electrically and physically connected to widened end portions of the base layer 20. The lateral dimensions of the contacts 40, in a horizontal plane, are less than the lateral dimensions of the contacts 36, 38. For example, the contacts 40 may have a diameter d1 that is less than the respective diameters d2 of the contacts 36, 38.

The contact 36 may be dimensioned to land on, and positioned to overlap with, the semiconductor layer 24 such that the contact 36 wraps around the semiconductor layer 24. In particular, the contact 36 may overlap with the side surface 50 and the top surface 54 (FIG. 2) of the semiconductor layer 24 to provide a wrap-around arrangement with both top and side overlap components. A section of the silicide layer 35 is positioned in a vertical direction between the top surface 54 of the semiconductor layer 24 and the contact 36. In an embodiment, the contact 36 may directly contact the side surface 50 of the semiconductor layer 24 and the section of the silicide layer 35 on the semiconductor layer 24. The dimensioning of the contact 36 may also result in the contact 36 landing on, and overlapping with, the top and side surfaces of the edge feature 32 such that the contact 36 also wraps around the edge feature 32. In the representative embodiment, because of the location of the bottom 37a of the opening 37 (FIG. 3), a lower portion 36a of the contact 36 is positioned in a vertical direction (i.e., in elevation) between the top surface 13 of the device layer 12 and the interface between the device layer 12 and buried insulator layer 14. In an embodiment, the contact 36 may directly contact the side surface 25 of the device layer 12.

The contact 38 may be dimensioned to land on, and positioned to overlap with, the semiconductor layer 26 such that the contact 38 wraps around the semiconductor layer 26. In particular, the contact 38 may overlap with the side surface 52 and the top surface 56 (FIG. 2) of the semiconductor layer 26 to provide a wrap-around arrangement with both top and side overlap components. A section of the silicide layer 35 is positioned in a vertical direction between the semiconductor layer 26 and the contact 38. In an embodiment, the contact 38 may directly contact the side surface 52 of the semiconductor layer 26 and the section of the silicide layer 35 on the semiconductor layer 26. The dimensioning of the contact 38 may also result in the contact 38 landing on, and overlapping with, the top and side surfaces of the edge feature 34 such that the contact 38 wraps around the edge feature 34. In the representative embodiment, because of the location of the bottom 39a of the opening 39 (FIG. 3), a lower portion 38a of the contact 38 is positioned in a vertical direction (i.e., in elevation) between the top surface 13 of the device layer 12 and the interface between the device layer 12 and buried insulator layer 14. In an embodiment, the contact 38 may directly contact the side surface 27 of the device layer 12.

The resultant device structure is a lateral bipolar junction transistor in which the semiconductor layers 24, 26 may provide portions of the emitter and collector and the base layer 20 is laterally positioned between the semiconductor layer 24 and the semiconductor layer 26. The raised semiconductor layers 24, 26 may be arranged on the top surface 13 of a device layer 12 of a silicon-on-insulator substrate. The width of the base layer 20 may be narrow (e.g., 10 nm to 20 nm). The device structure may exhibit a low contact resistance and a low capacitance, as well as a high transconductance and high-frequency figure of merit, due to the inclusion of the contacts 36, 38 that wrap around the semiconductor layers 24, 26 and that are enlarged in contrast to conventional emitter/collector contacts.

Figure 6:
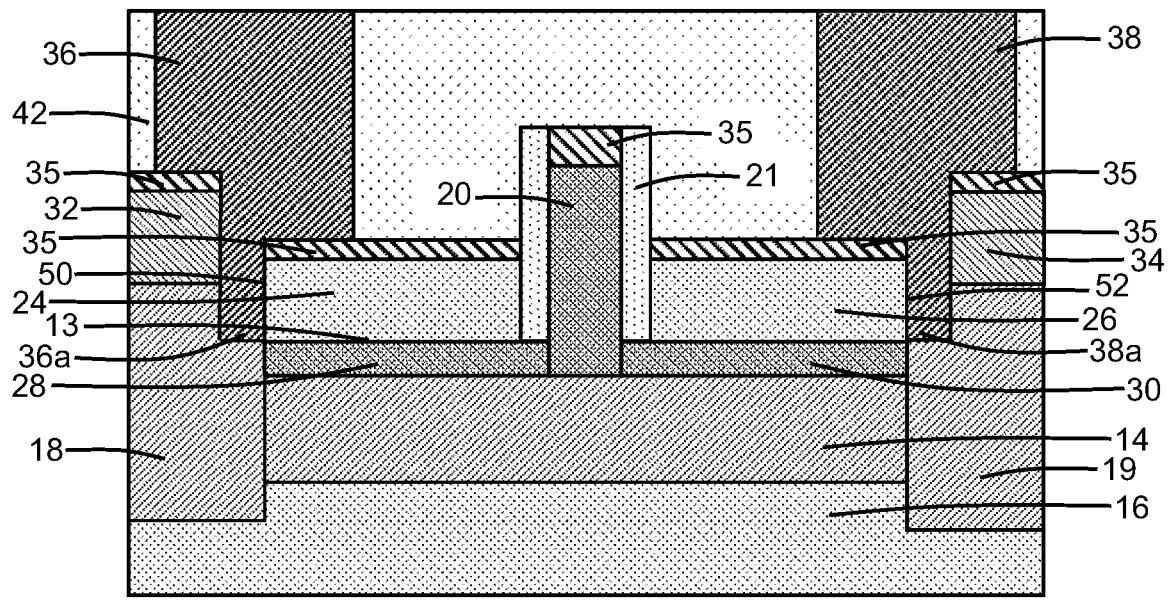
FIGS. 6 and 7 are cross-sectional views in accordance with alternative embodiments of the invention.

With reference to FIG. 6 and in accordance with alternative embodiments, the depth of the bottom 37a (FIG. 3) of the opening 37 may be adjusted such that the lower portion 36a of the contact 36 is located in a vertical direction at, or above, the top surface 13 of the device layer 12. For example, the lower portion 36a of the contact 36 may be positioned in a vertical direction (i.e., in elevation) between the top surface 13 of the device layer 12 and the top surface 54 (FIG. 2) of the semiconductor layer 24. Similarly, the depth of the bottom 39a (FIG. 3) of the opening 39 may be adjusted such that the lower portion 38a of the contact 38 is located in a vertical direction at or above the top surface 13 of the device layer 12. For example, the lower portion 38a of the contact 38 may be positioned in a vertical direction (i.e., in elevation) between the top surface 13 of the device layer 12 and the top surface 56 (FIG. 2) of the semiconductor layer 26.

Figure 7:
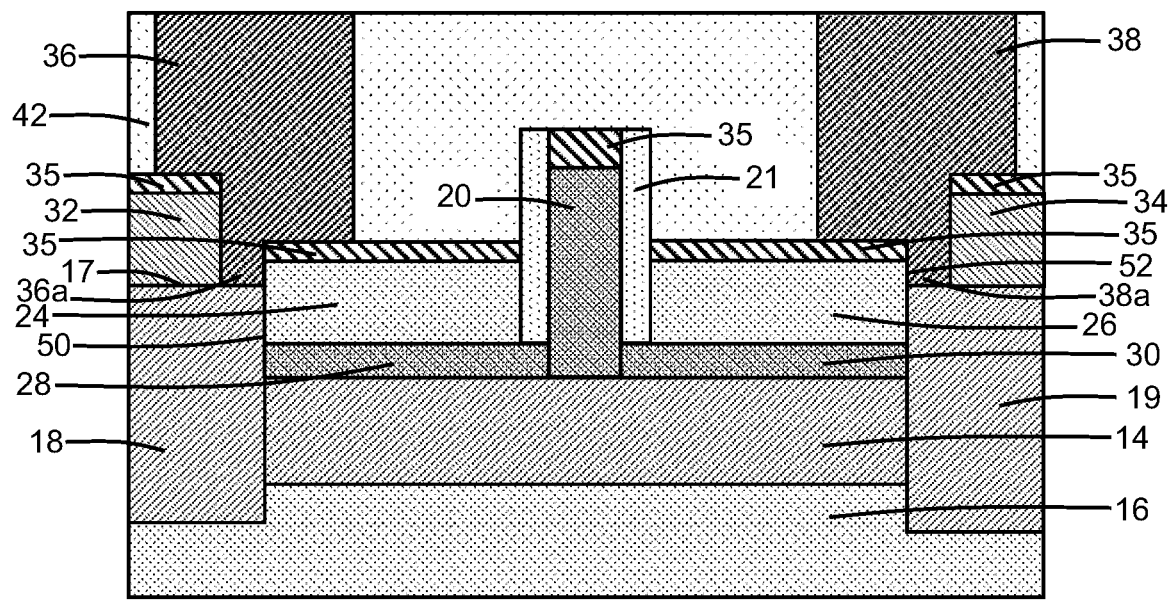

With reference to FIG. 7 and in accordance with alternative embodiments, the depth of the bottom 37a (FIG. 3) of the opening 37 may be adjusted such that the lower portion 36a of the contact 36 is located in a vertical direction at or above the top surface 17 of the shallow trench isolation region 18. For example, the lower portion 36a of the contact 36 may be positioned in a vertical direction (i.e., in elevation) between the top surface 17 of the shallow trench isolation region 18 and the top surface 54 (FIG. 2) of the semiconductor layer 24. Similarly, the depth of the bottom 39a (FIG. 3) of the opening 39 may be adjusted such that the lower portion 38a of the contact 38 is located in a vertical direction at or above the top surface 17 of the shallow trench isolation region 19. For example, the lower portion 38a of the contact 38 may be positioned in a vertical direction (i.e., in elevation) between the top surface 17 of the shallow trench isolation region 19 and the top surface 56 (FIG. 2) of the semiconductor layer 26.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a lateral bipolar junction transistor, the structure comprising:
   a first terminal including a first raised semiconductor layer that has a top surface and a side surface;
   a second terminal including a second raised semiconductor layer;
   a base layer positioned in a lateral direction between the first raised semiconductor layer of the first terminal and the second raised semiconductor layer of the second terminal; and
   a first contact positioned to overlap with the top surface and the side surface of the first raised semiconductor layer.

2. The structure of claim 1 wherein the second raised semiconductor layer has a top surface and a side surface, and further comprising:
   a second contact positioned to overlap with the top surface and the side surface of the second raised semiconductor layer.

3. The structure of claim 2 further comprising:
   a silicide layer having a first section on the top surface of the first raised semiconductor layer and a second section on the top surface of the second raised semiconductor layer, the first section of the silicide layer positioned between the first contact and the first raised semiconductor layer, and the second section of the silicide layer positioned between the second contact and the second raised semiconductor layer.

4. The structure of claim 1 further comprising:
   a silicide layer positioned between the top surface of the first raised semiconductor layer and the first contact.

5. The structure of claim 1 further comprising:
   a device layer comprised of a semiconductor material, the device layer having a top surface,
   wherein the first raised semiconductor layer is positioned on the top surface of the device layer, and the first contact has a lower portion positioned in elevation between the top surface of the device layer and the top surface of the first raised semiconductor layer.

6. The structure of claim 5 further comprising:
   a handle substrate; and
   a buried insulator layer arranged in a vertical direction to separate the handle substrate from the device layer.

7. The structure of claim 1 further comprising:
   a device layer comprised of a semiconductor material, the device layer having a top surface; and
   a shallow trench isolation region in the device layer, the shallow trench isolation region having a top surface,
   wherein the first raised semiconductor layer is positioned on the top surface of the device layer, and the first contact has a lower portion positioned in elevation between the top surface of the shallow trench isolation region and the top surface of the first raised semiconductor layer.

8. The structure of claim 7 further comprising:
   a handle substrate; and
   a buried insulator layer arranged in a vertical direction to separate the handle substrate from the device layer.

9. The structure of claim 1 further comprising:
   a device layer comprised of a semiconductor material, the device layer having a top surface;
   a handle substrate; and
   a buried insulator layer arranged in a vertical direction to separate the handle substrate from the device layer,
   wherein the first raised semiconductor layer is positioned on the top surface of the device layer, the device layer and the buried insulator layer adjoin along an interface, and the first contact has a lower portion positioned in elevation between the interface and the top surface of the first raised semiconductor layer.

10. The structure of claim 1 further comprising:
    a first edge feature positioned adjacent to the side surface of the first raised semiconductor layer,
    wherein the first contact is positioned to overlap with the first edge feature.

11. The structure of claim 10 wherein the second raised semiconductor layer has a top surface and a side surface, and further comprising:
    a second contact positioned to overlap with the top surface and the side surface of the second raised semiconductor layer.

12. The structure of claim 11 further comprising:
    a second edge feature positioned adjacent to the side surface of the second raised semiconductor layer,
    wherein the second contact is positioned to overlap with the second edge feature.

13. The structure of claim 1 wherein the first terminal is a collector of the lateral bipolar junction transistor, and the second terminal is an emitter of the lateral bipolar junction transistor.

14. The structure of claim 1 wherein the first terminal is an emitter of the lateral bipolar junction transistor, and the second terminal is a collector of the lateral bipolar junction transistor.

15. The structure of claim 1 wherein the first contact partially overlaps with the top surface of the first raised semiconductor layer and fully overlaps with the side surface of the first raised semiconductor layer.

16. The structure of claim 1 further comprising:
    a second contact positioned to overlap with the base layer, the first contact having larger lateral dimensions than the second contact.

17. A method of forming a structure for a lateral bipolar junction transistor, the method comprising:

forming a first terminal including a first raised semiconductor layer that has a top surface and a side surface;

forming a second terminal including a second raised semiconductor layer;

forming a base layer positioned in a lateral direction between the first raised semiconductor layer of the first terminal and the second raised semiconductor layer of the second terminal; and forming a first contact positioned to overlap with the top surface and the side surface of the first raised semiconductor layer.

18. The method of claim 17 wherein the second raised semiconductor layer has a top surface and a side surface, and further comprising:

forming a second contact positioned to overlap with the top surface and the side surface of the second raised semiconductor layer.

19. The method of claim 17 further comprising:

forming a first edge feature positioned adjacent to the side surface of the first raised semiconductor layer, wherein the first contact is positioned to overlap with the first edge feature.

20. The method of claim 17 further comprising:

forming a silicide layer positioned between the top surface of the first raised semiconductor layer and the first contact.

\* \* \* \* \*